(12) United States Patent
Lin

(10) Patent No.: US 8,289,194 B2
(45) Date of Patent: Oct. 16, 2012

(54) KEY ASSEMBLY AND ELECTRONIC DEVICE USING SAME

(75) Inventor: Chen-Ter Lin, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 615 days.

(21) Appl. No.: 12/537,266

(22) Filed: Aug. 7, 2009

(65) Prior Publication Data
US 2010/0265108 A1 Oct. 21, 2010

(51) Int. Cl.
*H03K 17/94* (2006.01)
*H01C 10/10* (2006.01)
(52) U.S. Cl. .................. 341/34; 338/47; 338/99
(58) Field of Classification Search .......... 341/22, 341/34; 338/13, 47
See application file for complete search history.

(56) References Cited

U.S. PATENT DOCUMENTS

| | | | |
|---|---|---|---|
| 3,982,219 A * | 9/1976 | Rehak | 338/96 |
| 4,203,088 A * | 5/1980 | Sado et al. | 338/114 |
| 6,504,492 B1 * | 1/2003 | Muurinen | 341/22 |
| 2004/0027231 A1 * | 2/2004 | Inoue et al. | 338/47 |

* cited by examiner

*Primary Examiner* — Howard Williams
(74) *Attorney, Agent, or Firm* — Altis Law Group, Inc.

(57) ABSTRACT

A key assembly includes a touching portion, and a detecting unit. The detecting unit includes a power source, a first detector, a second detector, a processor, a first resistor layer, and a second resistor layer parallel spaced from the first resistor layer. The first resistor layer includes a first end and a second end. The second resistor layer includes a third end and a fourth end. The first end is connected to a first electrode of the power source via the first detector, and the fourth end is connected to the first electrode of the power source via the second detector. The second and the third ends are connected to a second electrode of the power source. The processor electrically connected to the first detector and the second detector performs a predetermined function of the electronic device in response to electrical signals from the first and second detectors.

16 Claims, 9 Drawing Sheets

KEY ASSEMBLY AND ELECTRONIC DEVICE USING SAME

BACKGROUND

1. Technical Field

The present disclosure relates to a key assembly and an electronic device using the same.

2. Description of Related Art

An electronic device usually includes numerous input keys for users to provide input to the electronic device. However, one single input key provides a specific function of the electronic device. Therefore the electronic device must accommodate many keys to provide many functions. Also, pressing more than one key simultaneously may provide additional functions. However, more keys mean more valuable real estate will be used and pressing more than one key may be an inconvenience.

Therefore, a key assembly for an electronic device to avoid the above limitations and an electronic device using the same are desired.

DETAILED DESCRIPTION

Figure 1:
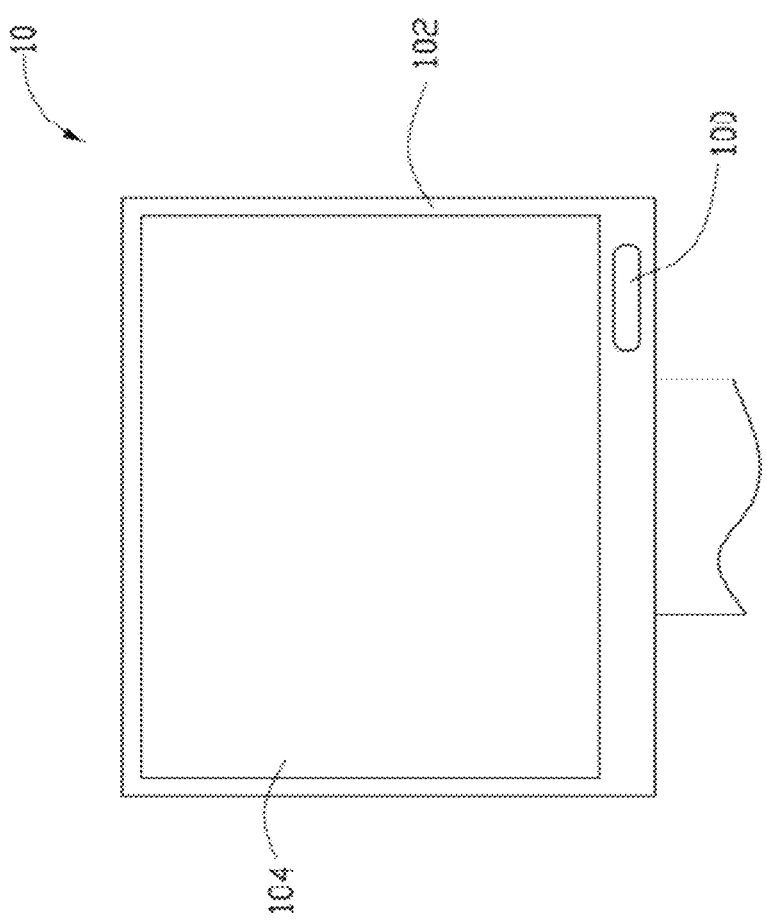
FIG. 1 is a schematic view of an electronic device including a key assembly, according to an exemplary embodiment.
Figure 2:
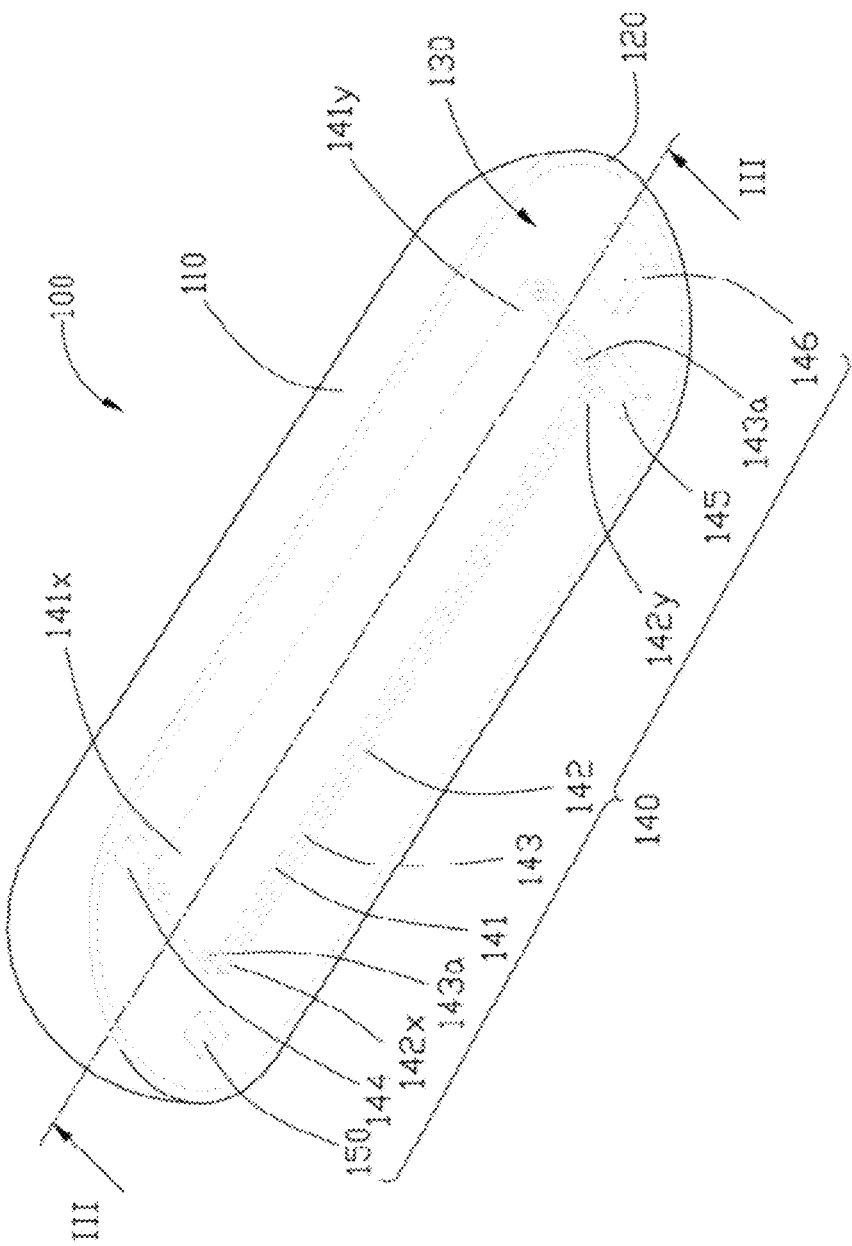
FIG. 2 is an isometric and schematic view of the key assembly including a detecting unit of the electronic device of FIG. 1.
Figure 3:
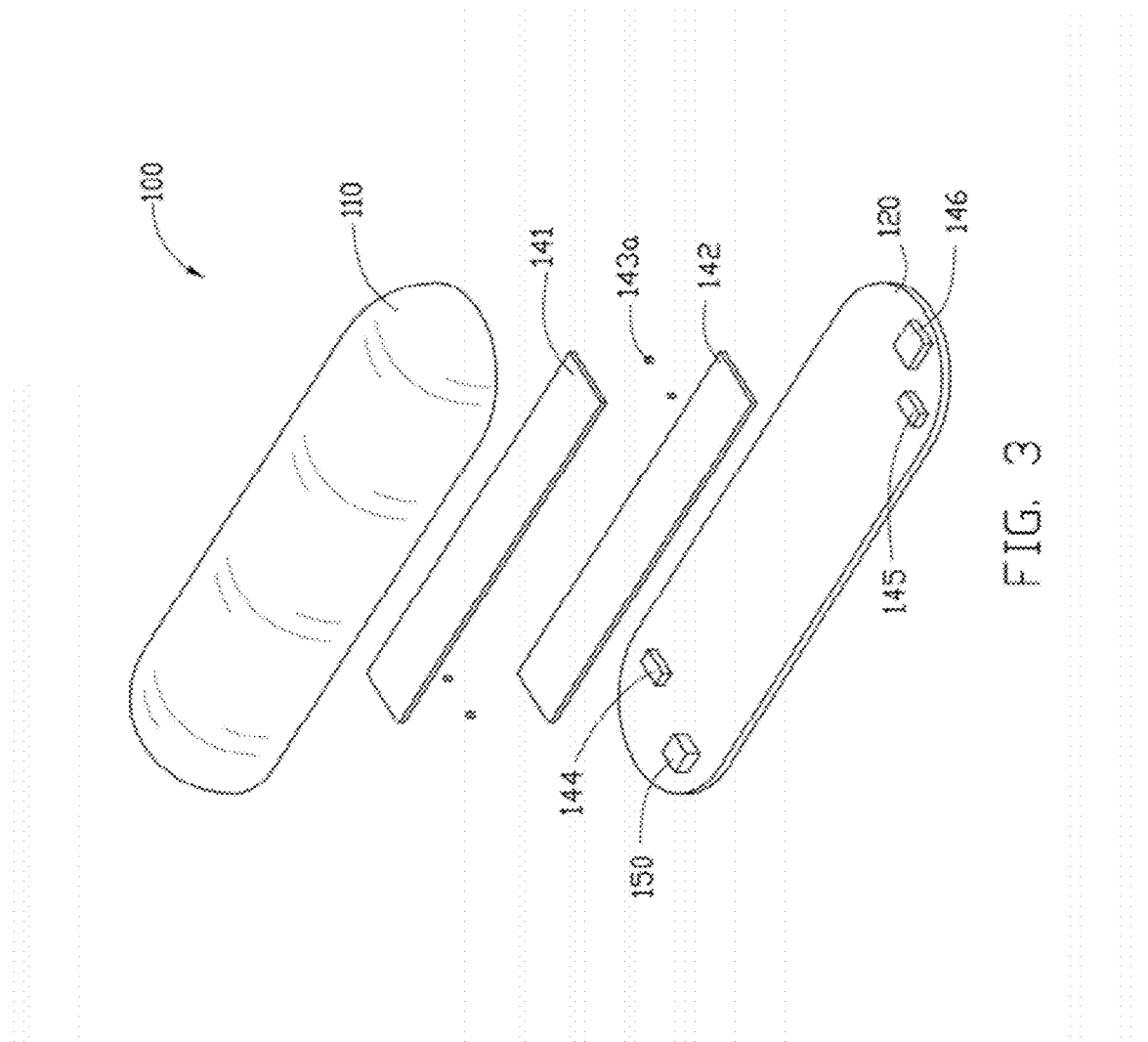
FIG. 3 is a disassembled view of the key assembly of FIG. 2.
Figure 4:
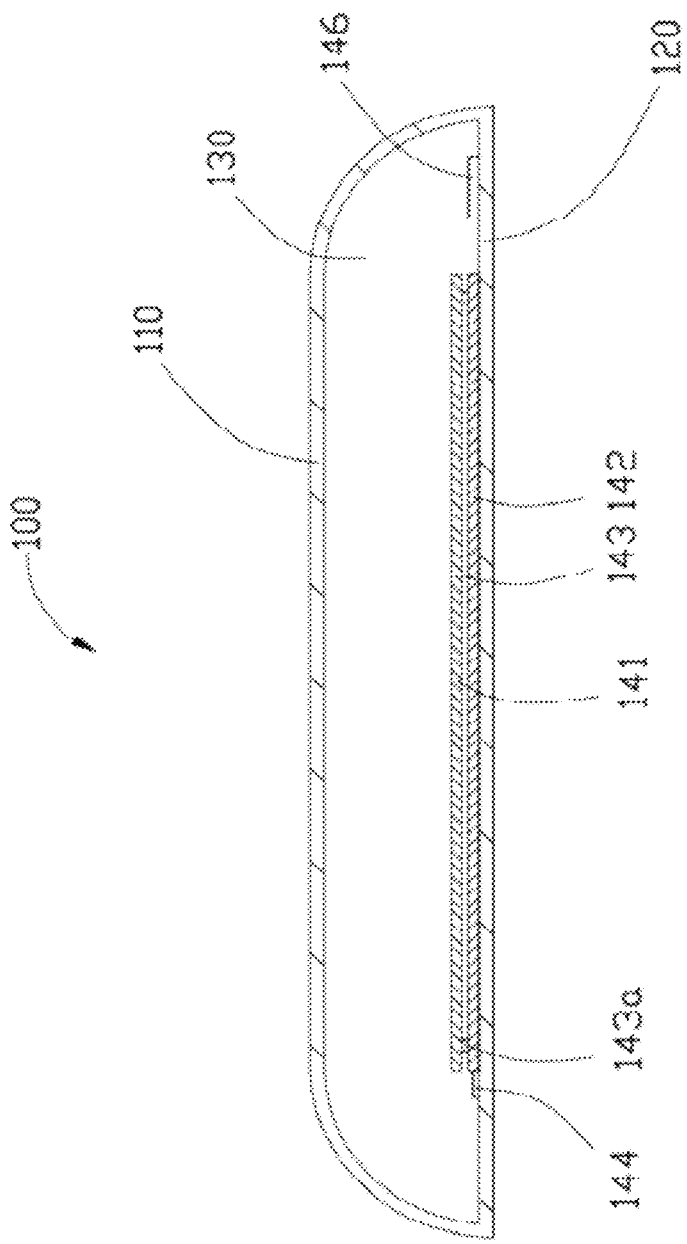
FIG. 4 is a cross-sectional view taken along line III-III of FIG. 2.

Referring to FIGS. 1 to 4, an electronic device 10 including a key assembly 100, according to an exemplary embodiment, is shown. The electronic device 10 is a television in this embodiment. The electronic device 10 includes a front plate 102 and a screen 104 attached to the front plate 102. The key assembly 100 is attached to the front plate 102 and is under the screen 104. The key assembly 100 includes a touching portion 110, a connecting portion 120, and a detecting unit 140. It is to be understood that the key assembly 100 may be attached to other plates (such as a top plate or a side plate) of the electronic device 10 in other embodiments.

The touching portion 110 is made from an elastic insulating rubber material and is positioned on the connecting portion 120. The connecting portion 120 is attached to the electronic device 10 to electrically connect the detecting unit 140 to the electronic device 10. The touching portion 110 and the connecting portion 120 cooperatively define a chamber 130. The detecting unit 140 is received in the chamber 130.

The detecting unit 140 includes a first resistor layer 141, a second resistor layer 142, a first detector 144, a second detector 145, a processor 146, and a power source 150.

The first resistor layer 141 is spaced parallel from the second resistor layer 142 using numerous insulating spacers 143a to define an air gap 143 therebetween. The first resistor layer 141 and the second resistor layer 142 are made from a uniform resistance material. A total resistance value of the first resistor layer 141 is equal to that of the second resistor layer 142 in this embodiment.

The first resistor layer 141 includes a first end 141x and a second end 141y opposite to the first end 141x. The second resistor layer 142 includes a third end 142x and a fourth end 142y opposite to the third end 142x. The first end 141x faces the third end 142x, and the second end 141y faces the fourth end 142y.

The first detector 144 and the second detector 145 are positioned on the connecting portion 120 at opposite two sides of the first resistor layer 141.

Figure 5:
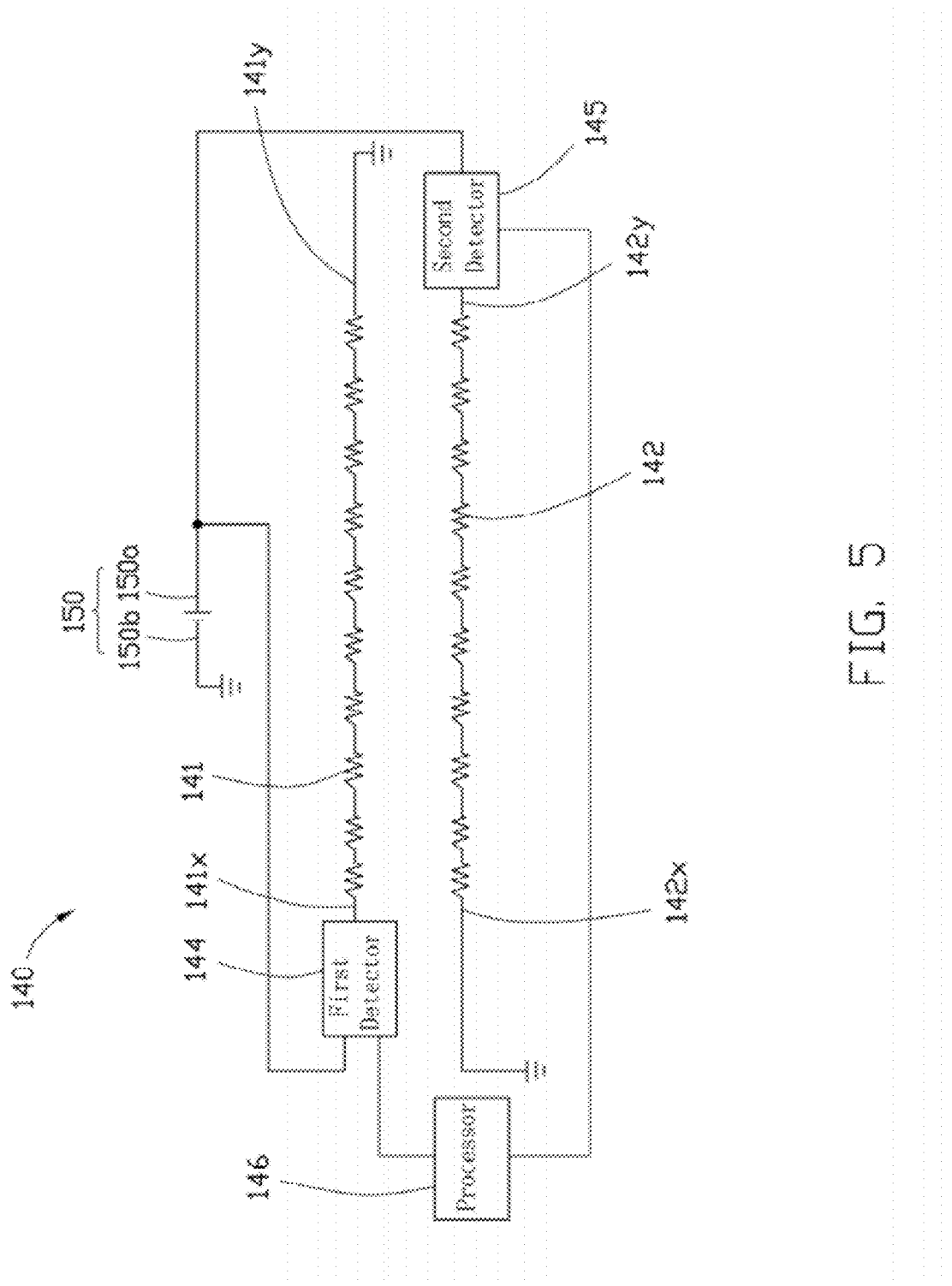
FIG. 5 is a circuit diagram of the detecting unit of the key assembly of FIG. 2.

Further referring to FIG. 5, the first resistor layer 141 and the first detector 144 are connected in series, which forms a first path. The second resistor layer 142 and the second detector 145 are connected in series, which forms a second path. The first path and the second path are connected in parallel.

The power source 150 includes a first electrode 150a and a second electrode 150b. The first end 141x is connected to the first electrode 150a via the first detector 144, and the fourth end 142y is connected to the first electrode 150a via the second detector 145. The second end 141y and the third end 142x are both connected to the second electrode 150b. In this embodiment, the first electrode 150a is the anode of the power source 150, and the second electrode 150b is the cathode of the power source 150. In other embodiments, the first electrode 150a may be the cathode of the power source 150, and the second electrode 150b may be the anode of the power source 150.

The processor 146 is electrically connected to the first detector 144 and the second detector 145. The processor 146 is configured for performing a predetermined function of the electronic device 10 in response to two electrical signals outputted from the first detector 144 and the second detector 145. In this embodiment, the first detector 144 and the second detector 145 are ammeters, and the two electrical signals are two currents detected by the first detector 144 and the second detector 145, respectively.

Figure 6:
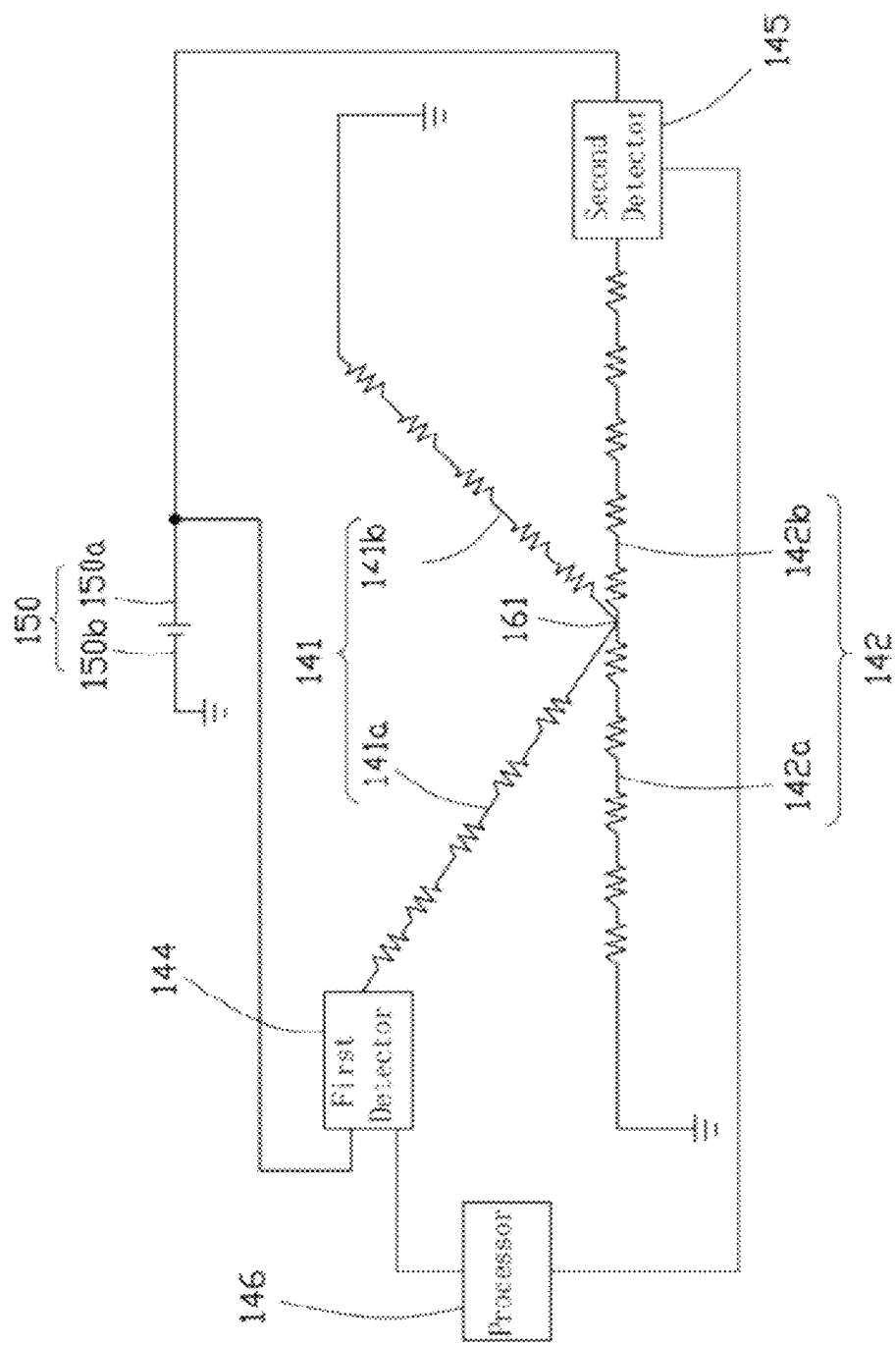
FIG. 6 is similar to FIG. 5, but showing the detecting unit under a working state.

Further referring to FIG. 6, when the touching portion 110 receives a single point touch input, the first resistor layer 141 contacts the second resistor layer 142 at a first point 161. The first resistor layer 141 is divided into a first resistor 141a with a resistance value $R_{11}$ and a second resistor 141b with a resistance value $R_{12}$, and the second resistor layer 142 is divided into a third resistor 142a with a resistance value $R_{13}$ and a fourth resistor 142b with a resistance value $R_{14}$. Wherein $R_{11}+R_{12}=R_{13}+R_{14}=R$, R is the resistance value of the first resistor layer 141 and is equal to of the second resistor layer 142. Because the air gap 143 is small relative to the first resistor layer 141 and the second resistor layer 142, the resistance value $R_{11}$ of the first resistor 141a can be considered to equal to the resistance value $R_{13}$ of the third resistor 142a, and the resistance value $R_{12}$ of the second resistor 141b can be considered to equal to the resistance value $R_{14}$ of the fourth resistor 142b, i.e., $R_{11}=R_{13}$, and $R_{12}=R_{14}$.

Figure 7:
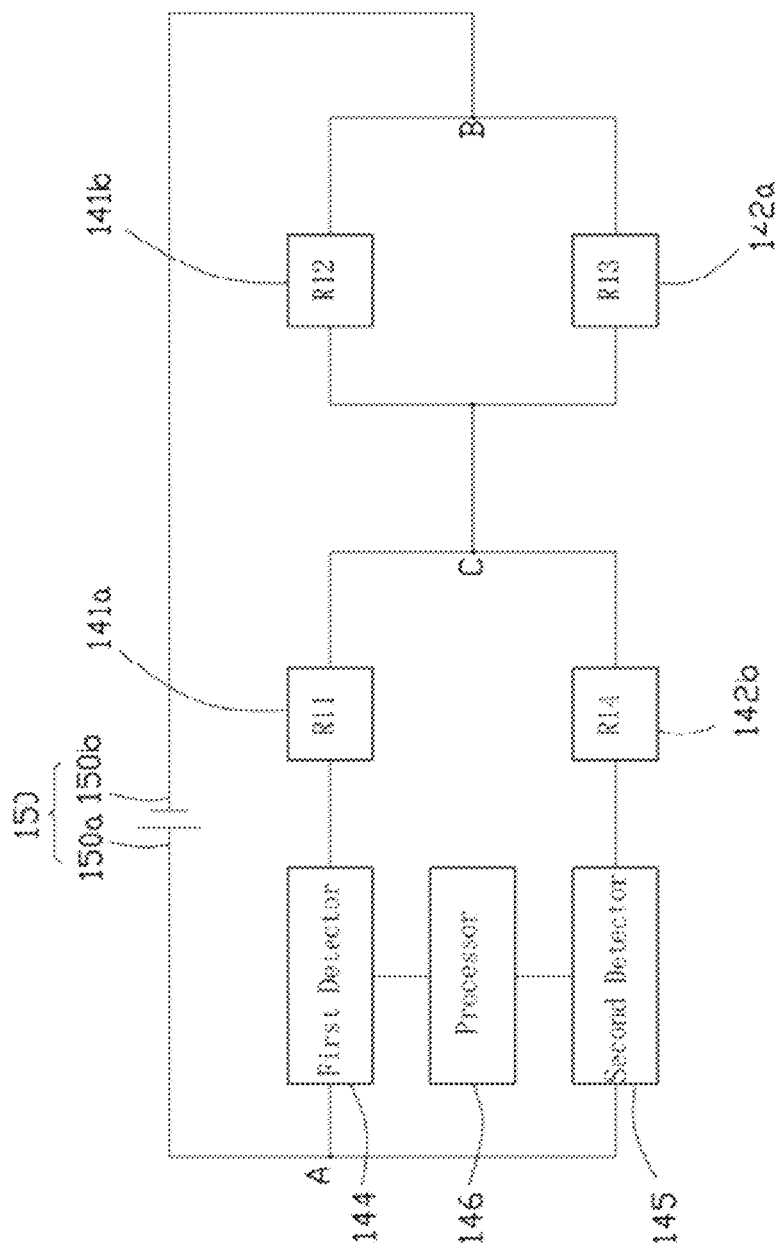
FIG. 7 is an equivalent circuit diagram of FIG. 6.

Further referring to FIG. 7, a first total resistance value $R_1$ between a node A and a node C is equal to $R_{11} \times R_{14}/(R_{11}+R_{14})$, and a second total resistance value $R_2$ between a node B and the node C is equal to $R_{12} \times R_{13}/(R_{12}+R_{13})$. Therefore, $R_1=R_2$, and a voltage value $U_c=U/2$, wherein U is the voltage value of the power source 150, and $U_c$, the voltage value between the node A and the node C, is constant. A current $I_{11}$ at the first detector 144 equals to $U_c/R_{11}$, and a current $I_{12}$ at the second detector 145 equals to $U_c/R_{14}$. Therefore, when the single point touch input moves back and forth along the touching portion 110, the resistance values $R_{11}$ and $R_{14}$ change accordingly, resulting in changes of the currents $I_{11}$ and $I_{12}$.

When the single point touch input moves towards the first detector 144 (see FIG. 2), the resistance value $R_{11}$ of the first resistor 141a and the resistance value $R_{13}$ of the third resistor 142a decrease and the resistance value $R_{12}$ of the second resistor 141b and the resistance value $R_{14}$ of the fourth resistor 142b increase. As a result, the current $I_{11}$ increases and the current $I_{12}$ decreases accordingly. Upon this condition, the processor 146 responds to the variation of the pair of the currents $I_{11}$ and $I_{12}$ by performing a first predetermined function of the electronic device 10, such as a mute function of the electronic device 10 and mutes the electronic device 10.

When the signal point touch input moves towards the second detector 145 (see FIG. 2), the resistance value $R_{11}$ of the first resistor 141a and the resistance value $R_{13}$ of the third resistor 142a increase and the resistance value $R_{12}$ of the second resistor 141b and the resistance value $R_{14}$ of the fourth resistor 142b decrease. As a result, the current $I_{11}$ decreases and the current $I_{12}$ increases accordingly. Upon this condition, the processor 146 responds to the variation of the pair of the currents $I_{11}$ and $I_{12}$ by performing a second predetermined function the electronic device 10, such as an unmute function of the electronic device 10 and unmutes the electronic device 10.

Figure 8:
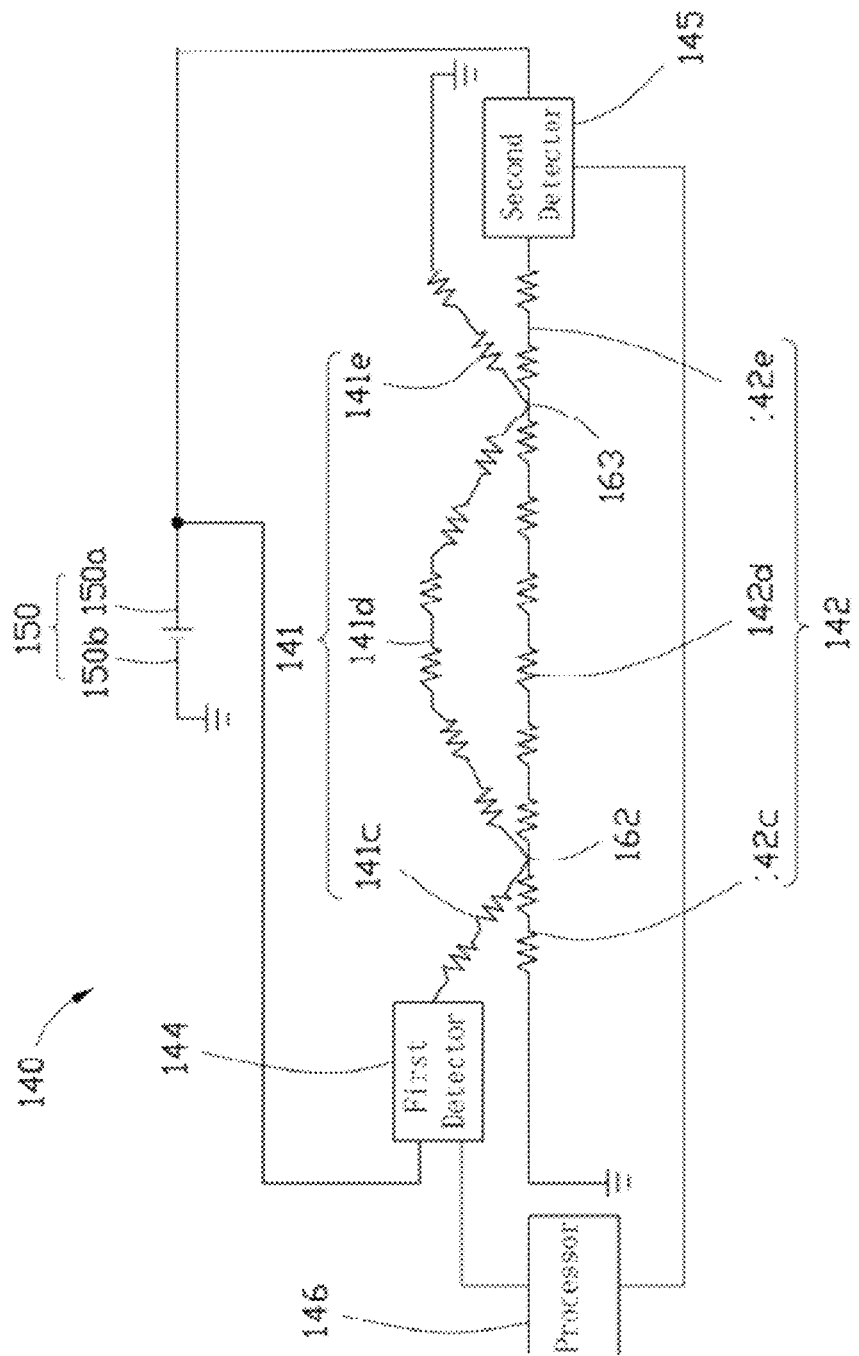
FIG. 8 is similar to FIG. 5, but showing the detecting unit under another working state.

Referring to FIG. 8, when the touching portion 110 receives a double point touch input, the first resistor layer 141 contacts the second resistor layer 142 at a second point 162 and a third point 163. The first resistor layer 141 is divided into a fifth resistor 141c with a resistance value $R_{21}$, a sixth resistor 141d with a resistance value $R_{22}$ and a seventh resistor 141e with a resistance value $R_{23}$, and the second resistor layer 142 is divided into an eighth resistor 142c with a resistance value $R_{24}$, a ninth resistor 142d with a resistance value $R_{25}$, and a tenth resistor 142e with a resistance value $R_{26}$. Wherein $R_{21}+R_{22}+R_{23}=R_{24}+R_{25}+R_{26}=R$, R is the resistance value of the first resistor layer 141 and is equal to that of the second resistor layer 142. It is to be understood that $R_{21}=R_{24}$, $R_{22}=R_{25}$, and $R_{23}=R_{26}$.

Figure 9:
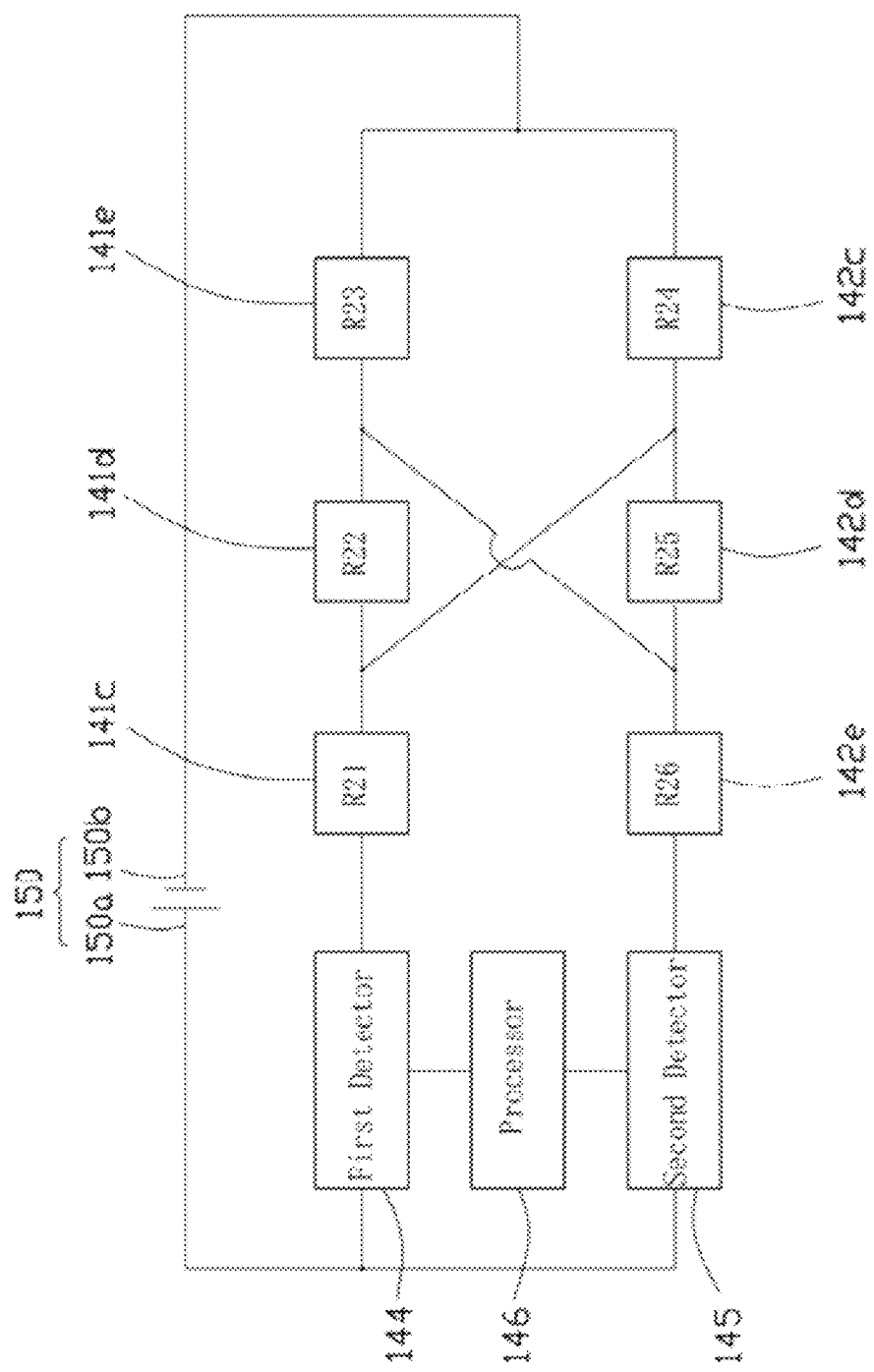
FIG. 9 is an equivalent circuit diagram of FIG. 8.

Further referring to FIG. 9, the current $I_{21}$ at the first detector 144 equals to $U/R_{10}$, and the current $I_{22}$ at the second detector 145 equals to $U/R_{20}$, wherein $R_{10}=R_{21}+(R_{22}+R_{23})\times R_{24}/(R_{22}+R_{23}+R_{24})=(2\times R_{21}\times R-R_{21}^2)/R$, and $R_{20}=R_{26}+(R_{24}+R_{25})\times R_{23}/(R_{23}+R_{24}+R_{25})=(2\times R_{26}\times R-R_{26}^2)/R$. Therefore, $I_{21}=U/R_{10}$, and $I_{22}=U/R_{20}$. When the double point touch input moves back and forth along the touching portion 110, the resistance values $R_{21}$ and $R_{26}$ change accordingly, resulting in changes of the currents $I_{21}$ and $I_{22}$.

When a first touch point of the double point touch input at the second point 162 moves towards the first detector 144 and a second touch point of the double point touch input at the third point 163 moves towards the second detector 145 (see FIG. 2), the resistance value $R_{21}$ of the fifth resistor 141c and the resistance value $R_{24}$ of the eighth resistor 142c decrease, and the resistance value $R_{23}$ of the seventh resistor 141e and the resistance value $R_{26}$ of the tenth resistor 142e decrease. As a result, the currents $I_{21}$ and $I_{22}$ increase accordingly. Upon this condition, the processor 146 responds to the variation of the pair of the currents $I_{21}$ and $I_{22}$ by performing a third predetermined function of the electronic device 10, such as an activation of the electronic device 10 from a standby mode of the electronic device 10 and activates the electronic device 10 from the standby mode.

When the first touch point of the double point touch input at the second point 162 and the second touch point of the double point touch input at the third point 163 move towards each other along the touching portion 110 (see FIG. 2), the resistance value $R_{21}$ of the fifth resistor 141c and the resistance value $R_{24}$ of the eighth resistor 142c increase, and the resistance value $R_{23}$ of the seventh resistor 141e and the resistance value $R_{26}$ of the tenth resistor 142e increase. As a result, the currents $I_{21}$ and $I_{22}$ decrease accordingly. Upon this condition, the processor 146 responds to the variation of the pair of the currents $I_{21}$ and $I_{22}$ by performing a fourth predetermined function of the electronic device 10, such as an inactivation of the electronic device 10 and enables the electronic device 10 into the standby mode.

When the first touch point of the double point touch input at the second point 162 moves towards the second detector 145 and the second touch point of the double point touch input at the third point 163 keeps still (see FIG. 2), the resistance value $R_{21}$ of the fifth resistor 141c and the resistance value $R_{24}$ of the eighth resistor 142c increase, and the resistance value $R_{23}$ of the seventh resistor 141e and the resistance value $R_{26}$ of the tenth resistor 142e remain unchanged. As a result, the current $I_{21}$ decreases and the current $I_{22}$ remains unchanged accordingly. Upon this condition, the processor 146 responds to the variation of the pair of the currents $I_{21}$ and $I_{22}$ by performing a fifth predetermined function of the electronic device 10, such as a displaying option selection of the electronic device 10 and selects the displaying option of the electronic device 10 rightwards.

When the first touch point of the double point touch input at the second point 162 moves towards the first detector 144 and the second touch point of the double point touch input at the third point 163 keeps still (see FIG. 2), the resistance value $R_{21}$ of the fifth resistor 141c and the resistance value $R_{24}$ of the eighth resistor 142c decrease, and the resistance value $R_{23}$ of the seventh resistor 141e and the resistance value $R_{26}$ of the tenth resistor 142e remain unchanged. As a result, the current $I_{21}$ increases and the current $I_{22}$ remains unchanged accordingly. Upon this condition, the processor 146 responds to the variation of the pair of the currents $I_{21}$ and $I_{22}$ by performing a sixth predetermined function of the electronic device 10, such as another displaying option selection of the electronic device 10 and selects the displaying option of the electronic device 10 leftwards.

When the first touch point of the double point touch input at the second point 162 keeps still and the second touch point of the double point touch input at the third point 163 moves towards the first detector 144 (see FIG. 2), the resistance value $R_{21}$ of the fifth resistor 141c and the resistance value $R_{24}$ of the eighth resistor 142c remain unchanged, and the resistance value $R_{23}$ of the seventh resistor 141e and the resistance value $R_{26}$ of the tenth resistor 142e increase. As a result, the current $I_{21}$ remains unchanged and the current $I_{22}$ decreases accordingly. Upon this condition, the processor 146 responds to the variation of the pair of the currents $I_{21}$ and $I_{22}$ by performing a seventh predetermined function of the electronic device 10, such as an entry of the selected displaying option of the electronic device 10 and turns down the volume of the selected displaying option. For example, the selected displaying option is a contrast option of the electronic device 10 and the contrast of the electronic device 10 is turned down.

When the first touch point of the double point touch input at the second point 162 keeps still and the second touch point of the double point touch input at the third point 163 moves towards the second detector 145 (see FIG. 2), the resistance value $R_{21}$ of the fifth resistor 141c and the resistance value $R_{24}$ of the eighth resistor 142c remain unchanged, and the resistance value $R_{23}$ of the seventh resistor 141e and the resistance value $R_{26}$ of the tenth resistor 142 decrease. As a result, the current $I_{21}$ remains unchanged and the current $I_{22}$ increases accordingly. Upon this condition, the processor 146 responds to the variation of the pair of the currents $I_{21}$ and $I_{22}$ by performing an eighth predetermined function of the electronic device 10, such as an entry of the selected displaying option of the electronic device 10 and turns up the volume of the selected displaying option. For example, the selected displaying option is a contrast option of the electronic device 10 and the contrast of the electronic device 10 is turned up.

The key assembly 100 can achieve a multi-function of the electronic device 10 according to different operations of the user on the touching portion 110.

It is to be understood, however, that even though numerous characteristics and advantages of the present disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A key assembly for an electronic device, comprising:
   a depressable touching portion; and
   a detecting unit covered by the touching portion, the detecting unit comprising a power source, a first detector, a second detector, a processor, a first resistor layer, and a second resistor layer parallel spaced from the first resistor layer, the first detector and the second detector being positioned at respective sides of the first resistor layer for obtaining a pair of currents flowing therethrough, the first resistor layer comprising a first end and a second end opposite to the first end, the second resistor layer comprising a third end and a fourth end opposite to the third end, the first end facing the third end, and the second end facing the fourth end, the first end being connected to a first electrode of the power source via the first detector, the fourth end being connected to the first electrode of the power source via the second detector, the second end and the third end being connected to a second electrode of the power source, the processor being electrically connected to the first detector and the second detector, and being configured for performing a predetermined function of the electronic device in response to one of the plurality of variations of the pair of currents outputted from the first detector and the second detector.

2. The key assembly of claim 1, wherein the first resistor layer is made from a uniform resistance material.

3. The key assembly of claim 1, wherein the second resistor layer is made from a uniform resistance material.

4. The key assembly of claim 1, wherein a resistance value of the first resistor layer is equal to that of the second resistor layer.

5. The key assembly of claim 1, wherein the touching portion is made from an elastic insulating rubber material.

6. The key assembly of claim 1, further comprising a connecting portion, the touching portion positioned on the connecting portion to cooperatively define a chamber, the detecting unit received in the chamber, the connecting portion electrically connecting the detecting unit to the electronic device.

7. The key assembly of claim 1, further comprising a plurality of insulating spacers spacing the first resistor layer parallel from the second resistor layer to define an air gap therebetween.

8. The key assembly of claim 1, wherein the plurality of variations comprises:

a first variation that the current outputted from the first detector increases, and the current outputted from the second detector decreases;

a second variation that the current outputted from the first detector decreases, and the current outputted from the second detector increases;

a third variation that the pair of currents outputted from the first detector and the second detector both increase;

a fourth variation that the pair of currents outputted from the first detector and the second detector both decrease a fifth variation that the current outputted from the first detector remains unchanged, and the current outputted from the second detector increases;

a sixth variation that the current outputted from the first detector remains unchanged, and the current outputted from the second detector decreases;

a seventh variation that the current outputted from the first detector increases, and the current outputted from the second detector remains unchanged; and an eighth variation that the current outputted from the first detector decreases, and the current outputted from the second detector remains unchanged.

9. An electronic device, comprising:
   a plate; and
   a key assembly attached to the plate, the key assembly comprising:
   a depressable touching portion; and
   a detecting unit covered by the touching portion, the detecting unit comprising a power source, a first detector, a second detector, a processor, a first resistor layer, and a second resistor layer parallel spaced from the first resistor layer, the first detector and the second detector being positioned at respective sides of the first resistor layer for obtaining a pair of currents flowing therethrough, the first resistor layer comprising a first end and a second end opposite to the first end, the second resistor layer comprising a third end and a fourth end opposite to the third end, the first end facing the third end, and the second end facing the fourth end, the first end being connected to a first electrode of the power source via the first detector, the fourth end being connected to the first electrode of the power source via the second detector, the second end and the third end being connected to a second electrode of the power source, the processor electrically being connected to the first detector and the second detector, and being configured for performing a predetermined function of the electronic device in response to one of the plurality of variations of the pair of currents outputted from the first detector and the second detector.

10. The electronic device of claim 9, wherein the first resistor layer is made from a uniform resistance material.

11. The electronic device of claim 9, wherein the second resistor layer is made from a uniform resistance material.

12. The electronic device of claim 9, wherein a resistance value of the first resistor layer is equal to that of the second resistor layer.

13. The electronic device of claim 9, wherein the touching portion is made from an elastic insulating rubber material.

14. The electronic device of claim 9, further comprising a connecting portion, the touching portion positioned on the connecting portion to cooperatively define a chamber, the detecting unit received in the chamber, the connecting portion electrically connecting the detecting unit to the electronic device.

15. The electronic device of claim 9, further comprising a plurality of insulating spacers spacing the first resistor layer parallel from the second resistor layer to define an air gap therebetween.

16. The electronic device of claim 9, wherein the plurality of variations comprises:
- a first variation that the current outputted from the first detector increases, and the current outputted from the second detector decreases;
- a second variation that the current outputted from the first detector decreases, and the current outputted from the second detector increases;
- a third variation that the pair of currents outputted from the first detector and the second detector both increase;
- a fourth variation that the pair of currents outputted from the first detector and the second detector both decrease a
- fifth variation that the current outputted from the first detector remains unchanged, and the current outputted from the second detector increases;
- a sixth variation that the current outputted from the first detector remains unchanged, and the current outputted from the second detector decreases;
- a seventh variation that the current outputted from the first detector increases, and the current outputted from the second detector remains unchanged; and
- an eighth variation that the current outputted from the first detector decreases, and the current outputted from the second detector remains unchanged.

* * * * *

UNITED STATES PATENT AND TRADEMARK OFFICE
CERTIFICATE OF CORRECTION

PATENT NO. : 8,289,194 B2
APPLICATION NO. : 12/537266
DATED : October 16, 2012
INVENTOR(S) : Chen-Ter Lin Page 1 of 1

It is certified that error appears in the above-identified patent and that said Letters Patent is hereby corrected as shown below:

Title Page, Item (30) regarding "Foreign Application Priority Data" below Item (22) insert:

-- (30)  Foreign Application Priority Data

Apr. 17, 2009  (CN) ...........................200910301650.9 --

Signed and Sealed this
Twenty-second Day of October, 2013

Teresa Stanek Rea
*Deputy Director of the United States Patent and Trademark Office*